United States Patent [19]

De Luca et al.

[11] Patent Number: 4,725,510

[45] Date of Patent: Feb. 16, 1988

[54] SOURCE FOR VAPOR-DEPOSITING MANGANESE

[75] Inventors: Olympio De Luca, Soisy-sur-Seine; Robert Meunier, Ris-Orangis, both of France

[73] Assignee: U.S. Philips Corporation, New York, N.Y.

[21] Appl. No.: 327,373

[22] Filed: Dec. 4, 1981

[30] Foreign Application Priority Data

Dec. 24, 1980 [FR] France ............................ 80 27424

[51] Int. Cl.⁴ .............................................. B32B 15/02
[52] U.S. Cl. .................................. 428/607; 428/615; 428/662; 428/663; 428/665; 156/600; 156/610; 219/271; 313/550; 427/250
[58] Field of Search ................ 427/250; 219/271, 158, 219/56; 313/550; 156/600, 610

[56] References Cited

U.S. PATENT DOCUMENTS

| | | | |
|---|---|---|---|
| 2,100,045 | 11/1937 | Alexander | 313/550 |
| 2,450,854 | 10/1948 | Colbert et al. | 427/250 |
| 3,171,017 | 2/1965 | Siddall et al. | 219/271 |
| 3,637,421 | 1/1972 | Gimigliano | 427/250 |

Primary Examiner—Gregory A. Heller
Assistant Examiner—Robert M. Kunemund
Attorney, Agent, or Firm—Robert J. Kraus

[57] ABSTRACT

A source for vapor depositing manganese onto a substrate in a vacuum. The source is formed by a chain of metallic beads fused around a wire. The material of the wire has a high recrystallization temperature, the beads consist of an alloy of manganese and one or more other substances from the group of metals and metalloids having a saturated vapor pressure much lower than that of manganese, and the fusion temperature of the alloy is lower than that of pure manganese and lower than the recrystallization temperature of the material of the wire. The beads are formed by securing blocks of the alloy to the wire by means of electric welding, after which the blocks are fused around the wire and are cooled.

11 Claims, 3 Drawing Figures

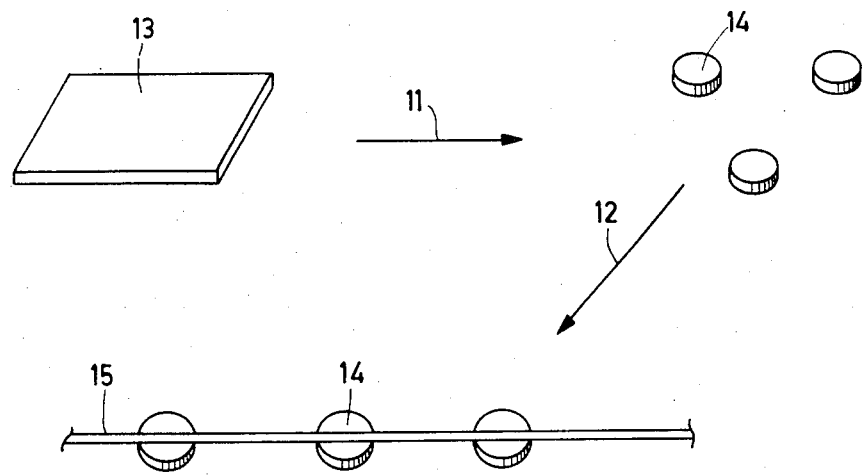
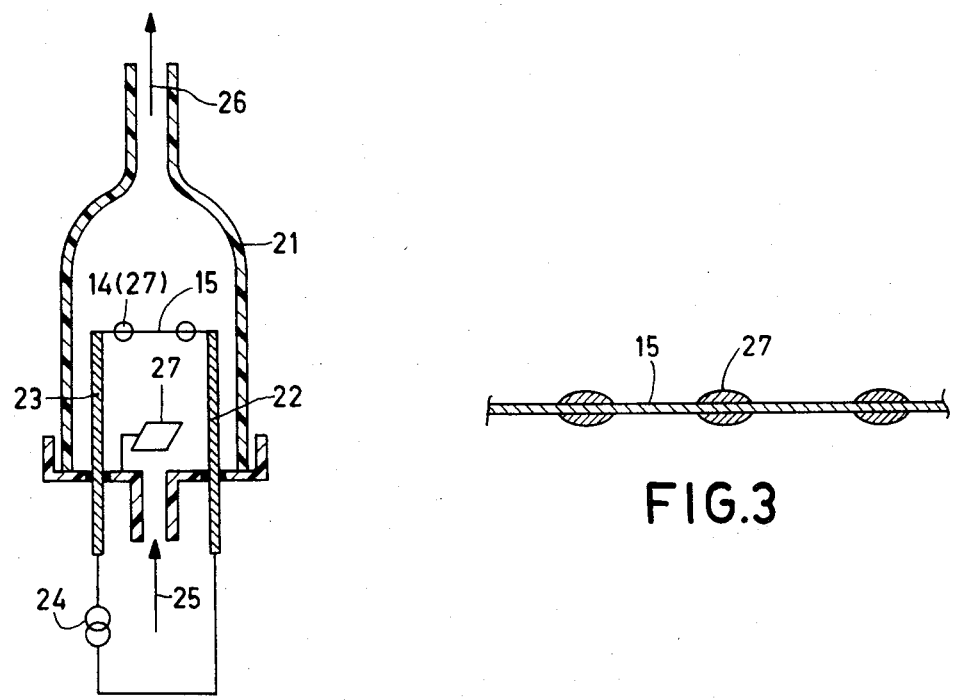
FIG.1
FIG.2
FIG.3

SOURCE FOR VAPOR-DEPOSITING MANGANESE

BACKGROUND OF THE INVENTION

The invention relates to a source of vapour-depositing manganese from the solid state onto a substrate in a vacuum. This vapour deposition source is used in particular for forming a MnO-layer by oxidation on the substrate for a photosensitive layer or for a secondary electron-emitting layer of a photo-electric tube. The manganese oxide layer serves as a substrate for the photosensitive layer or for the secondary electron-emitting layer. The invention also relates to a method of manufacturing such a vapour deposition source.

Such sources for vapour-depositing manganese are known from U.S. Pat. No. 3,637,421. In these sources a binary mixture or a binary alloy of manganese and other metal, for example nickel, is used in such manner that the melting-point of the mixture or alloy in the same vacuum conditions is lower than that of manganese alone. The other metal is chosen such that its vapour pressure is very low and is at least 100 times smaller than that of manganese so that during vapour-deposition only insignificant traces of the other metal are present in the layer. According to the Patent Specification the vapour deposition source is a molten manganese mixture or alloy provided in a melting crucible made of a material such as tantalum which reacts only slightly with the mixture or alloy. Said melting crucible is heated, for example, by electron bombardment. In general such a source forms part of a bulky vapour deposition plant and cannot be used in a photo-electric tube during the manufacture thereof to obtain an intermediate layer of MnO. In tube manufacture it is preferable to use a vapour deposition source symmetrically disposed opposite to the surface of the substrate to be coated, which can be permanently provided in the tube, the vapour deposition taking place by sublimation (the transition of the material from the solid state into the vapour state). Such sources are known in the form of manganese beads which are provided at a distance from each other on an electrically conductive wire which consists, for example, of molybdenum or tungsten. This source is provided, for example, in a photoelectric tube in the form of a wreath which is situated opposite to the inner surface of the window of the tube which serves as a substrate for the photo-sensitive layer. The manganese is heated and evaporated by means of a current flowing in the wire conductor. The formation and the connection of the beads to the wire conductor are carried out by fusing small quantities of manganese in the form of powder or small particles in contact with the wire and then cooling again. It is necessary for the wire to be heated to a temperature of at least 1250° C. because a matrix of refractory oxide (MnO) surrounds the manganese. On the one hand, only beads of small dimensions are thus formed so that the quantity of evaporable manganese is limited. On the other hand the molybdenum or tungsten, after having been heated at these temperatures, becomes brittle upon cooling so that the vapour deposition source formed by the chain of beads thus obtained is fragile and difficult to handle.

SUMMARY OF THE INVENTION

It is an object of the invention to provide a vapour deposition source which can better be handled and is less fragile.

Another object of the invention is to provide a method of manufacturing such a vapour deposition source.

According to the invention, such a vapour deposition source is formed by a metallic bead or chain of beads fused around a wire. The material of the wire having a high recrystallization temperature, the beads consisting of an alloy of manganese and one or more other materials from a group of metals and metalloids having a saturated vapour pressure which is much lower than that of manganese, the melting temperature of the alloy being lower than that of pure manganese and lower than the recrystallization temperature of the material of the wire.

The source thus formed has the advantage of being less fragile and the wire is not brittle and can withstand deformations when the chain of beads is placed in the tube. The volume of the beads is not limited so that the quantity of evaporable manganese may be large. The wire which serves as a carrier for the beads is of a metal which does not recrystallize or recrystallizes only slightly after the wire has been heated to the high operating temperatures. The material from which each bead is formed does not have a fragmented and granular structure before melting, such as pure manganese, but is in the form of a block of a deformable and ductile alloy. This block may be manufactured from a thin sheet, from a ribbon or from a wire and the like. Said block may be secured to the wire by electric welding. The blocks thus secured to the wire and then fused to the wire by heating. Said heating may be carried out by passing an electric current through the wire, by means of a laser beam or by means of high-frequency heating, in which each block after melting and cooling forms a bead surrounding the wire. The metal of the wire is generally a refractory metal, for example, tantalum, molybdenum or tungsten. The material of the blocks is an alloy of manganese and one or more materials from the group of metals and/or metalloids, for example, nickel, gold, boron, beryllium, carbon, cerium, cobalt, chromium, copper, tin, iron, germanium, palladium, silicon and platinum, in such quantities that fusing the blocks to the wire takes place at temperatures which are lower than the melting temperature of pure Mn and lower than the recrystallization temperature of the material of the wire serving as a carrier. The vapour-deposited manganese comprises very few traces of the other metals and/or metalloids. The vapour deposition takes place at temperatures which are lower than those for beads of pure manganese and lower than the recrystallization temperature of the metal of the wire serving as a carrier for the beads.

BRIEF DESCRIPTION OF THE DRAWING

The invention will now be described in greater detail, by way of example, with reference to the accompanying drawing, in which:

FIG. 1 is an elevation of the two first stages of the manufacture of the source for vapour-depositing manganese, FIG. 2 is a diagrammatic sectional view of the third stage of the manufacture, and FIG. 3 is a longitudinal sectional view of the resulting vapour deposition source.

DESCRIPTION OF THE PREFERRED EMBODIMENT

FIG. 1 shows the first two stages for the formation of the vapour deposition source. The arrows 11 and 12 denote the transition from one stage to the other. The starting material for the vapour deposition of manganese is an alloy of, for example, Mn and Ni with 90% Mn and 10% Ni, in which said material has the form of a laminated plate 13 having a thickness of, for example, 0.5 mm. Discs 14 are cut from said plate by means of a punching machine. The diameter of the discs is, for example, in the order of magnitude of 1 mm, each disc weighing approximately 5 mg. The tantalum wire 15 which has a diameter of, for example, 0.2 mm is laid on said discs. Each disc is secured to the tantalum wire by means of electric spot welding. The tantalum wire and attached discs is placed in a vacuum bell 21 as shown in FIG. 2. The tantalum wire in the bell is connected to two electrically conductive supports 22, 23, which are connected to the electric current source 24 located outside the bell and by means of which the fusion of the discs to the tantalum wire takes place. During said fusion, argon flows through the bell as denoted by the arrows 25, 26 in such manner that oxidation of the metal is prevented, the argon flow being deflected by the deflector 27. The current necessary for the fusion depends on the diameter of the wire and on the number and the volume of the discs and in the present example lies in the order of magnitude of 4 A, the number of discs being six. However, fusion may also take place by means of a high energy laser beam directed through the bell and successively directed at each individual disc. Said fusion may be alternatively carried out by high-frequency heating in which the turns of the coil of the heating source are inductively coupled to each disc in succession. For that purpose, in order to obtain a good inductive coupling between the turns and the disc, the tantalum wire with the attached discs are placed close to the wall of the bell.

FIG. 3 is a sectional view of the chain of beads which is obtained after cooling. Each bead 27 surrounds the tantalum wire 15. The temperature reached during the fusion lies in the order of magnitude of 1160° C. and is lower than the melting temperature of pure manganese and lower than the temperature at which the tantalum of the wire would recrystallise after cooling.

As already indicated, according to the invention wires of a refractory material other than tantalum, for example molybdenum and tungsten may also be used. Also, the nickel in the discs connected to the wire conductor may be replaced by one or more other metals and/or metalloids of which the saturated vapour pressure is very low as compared with that of manganese, for example, gold, boron, beryllium, carbon, cerium, cobalt, chromium, copper, tin, iron, germanium, palladium, silicon and platinum, in such quantities that the fusion of the discs to the wire takes place at temperatures which are lower than those of Mn and lower than the recrystallization temperature of the supporting wire.

The chain of beads thus formed may very readily be used during the manufacture of a photoelectric tube for evaporating manganese from the solid state. By oxidation of the manganese an intermediate layer of manganese oxide is obtained, for example MnO, on the substrate for the photo-sensitive layer or for a secondary electron-emissive layer. In that case, since the formation of the various components of the tube must take place in a controlled vacuum without interrupting the vacuum, the chain of beads in permanently provided in the tube opposite to the surfaces to be coated in a place where said chain is not annoying in the finished tube.

What is claimed is:

1. A vapor deposition source for depositing manganese from the solid state onto a substrate in a vacuum, said source comprising at least one bead of a manganese alloy fused around a wire by heating a block of the manganese alloy attached to the wire, said alloy consisting essentially of manganese and at least one material selected from the group of metals and metalloids having vapor pressures which are small in comparison with that of manganese, said alloy further having a fusing temperature below pure manganese and below the recrystallization temperature of the wire material.

2. A vapor deposition source as in claim 1, characterized in that the wire consists essentially of tantalum and said group consists of nickel, gold, boron, beryllium, carbon, cerium, cobalt, chromium, copper, tin, germanium, palladium, silicon and platinum.

3. A vapor deposition source as in claim 1, characterized in that the wire consists essentially of molybdenum and said group consists of nickel, gold, boron, beryllium, carbon, cerium, cobalt, chromium, copper, tin germanium, palladium, silicon and platinum.

4. A vapor deposition source as in claim 1, characterized in that the wire consists essentially of tungsten and said group consists of nickel, gold, boron, beryllium, carbon, cerium, cobalt, chromium, copper, tin germanium, palladium, silicon and platinum.

5. A vapor deposition source as in claim 1, 2, 3, or 4, characterized in that said alloy includes 5 to 40% by volume of nickel.

6. A vapor deposition source as in claim 5, characterized in that the alloy includes approximately 10% by volume of nickel.

7. A vapor deposition source as in claim 1, characterized in that said block is spot welded to the wire and is fused in a neutral atmosphere.

8. A vapor deposition source as in claim 7, characterized in that said block is heated to fusion by passing an electric current through the wire.

9. A vapor deposition source as in claim 7, characterized in that the block is heated to fusion by means of a laser beam.

10. A vapor deposition source as in claim 7, characterized in that the block is fused by means of high frequency heating.

11. A vapor deposition source as in claim 1 comprising a plurality of said beads individually heated to fusion.

* * * * *